United States Patent
Zhao et al.

(10) Patent No.: US 11,031,925 B2
(45) Date of Patent: Jun. 8, 2021

(54) FREQUENCY MULTIPLYING CIRCUIT FOR CLOCK SIGNAL

(71) Applicant: SPREADTRUM COMMUNICATIONS (SHANGHAI) CO., LTD., Shanghai (CN)

(72) Inventors: Guobi Zhao, Shanghai (CN); Jiewei Lai, Shanghai (CN)

(73) Assignee: SPREADTRUM COMMUNICATIONS (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 16/863,301

(22) Filed: Apr. 30, 2020

(65) Prior Publication Data

US 2020/0382107 A1   Dec. 3, 2020

(30) Foreign Application Priority Data

May 31, 2019   (CN) .......................... 201910466381.5

(51) Int. Cl.

| | |
|---|---|
| *H03K 5/00* | (2006.01) |
| *H03K 17/56* | (2006.01) |
| *H03L 7/16* | (2006.01) |
| *H03K 5/133* | (2014.01) |
| *H03K 5/135* | (2006.01) |
| *H03K 5/156* | (2006.01) |

(52) U.S. Cl.
CPC ......... *H03K 5/00006* (2013.01); *H03K 5/133* (2013.01); *H03K 5/135* (2013.01); *H03K 5/1565* (2013.01)

(58) Field of Classification Search
None
See application file for complete search history.

(56) References Cited

U.S. PATENT DOCUMENTS

| | | | |
|---|---|---|---|
| 9,680,454 B2 * | 6/2017 | Chueh | .................... H03B 19/14 |
| 10,419,204 B2 * | 9/2019 | Hailu | ......................... G06F 1/10 |
| 10,666,239 B2 * | 5/2020 | Boeck | ................ H03K 5/00006 |

\* cited by examiner

*Primary Examiner* — Kenneth B Wells
(74) *Attorney, Agent, or Firm* — Cantor Colburn LLP

(57) ABSTRACT

Frequency multiplying circuit for clock signal is provided, including N branches and an N-times frequency multiplying circuit, wherein each branch includes a buffer and a frequency doubling circuit, and the frequency doubling circuit doubles a frequency of a reference clock signal to obtain a frequency doubled reference clock signal, wherein the N-times frequency multiplying circuit includes: N second calibration delay circuits coupled to the N frequency doubling circuits respectively, wherein each second calibration delay circuit performs clock delay on the frequency doubled reference clock signal to obtain a clock delayed frequency doubled reference clock signal; and an N-path phase combination circuit coupled to the N second calibration delay circuits, and configured to perform phase combination on the N clock delayed frequency doubled reference clock signals to obtain a 2N-times frequency multiplied reference clock signal. Cost is reduced, and phase noise of a multi-times frequency multiplied reference clock signal is optimized.

16 Claims, 1 Drawing Sheet

FREQUENCY MULTIPLYING CIRCUIT FOR CLOCK SIGNAL

CROSS-REFERENCE TO RELATED APPLICATIONS

This present invention claims priority under 35 U.S.C. § 119 to Chinese Patent Application No. 201910466381.5, filed on May 31, 2019, the entire content of which is incorporated herein by reference.

TECHNICAL FIELD

The present disclosure generally relates to communication technology field, and more particularly, to a frequency multiplying, circuit for a clock signal.

BACKGROUND

With wider commercial use of 5G millimeter-wave frequency bands, Radio Frequency (RF) transceivers pose a higher challenge to phase noise of a local oscillator signal. In existing frequency multiplying solutions, frequency multiplying is generally performed on a reference clock signal output by a single buffer, where a frequency of the reference clock signal is doubled using non-correlation of rising and falling edges of the single buffer. However, for a high-performance local oscillator application scenario, noise of a sine-to-square-wave buffer which contributes most reference phase noise is not optimized.

To obtain a multi-times frequency multiplied reference clock with high phase noise quality, different manufacturers have tried to use crystal oscillators with higher frequency and higher accuracy to provide reference clocks for millimeter-wave frequency synthesis circuits. In existing millimeter-wave Multiple Input Multiple Output (MIMO) systems, each phase control unit uses an independent reference clock, and each transceiver unit uses an independent reference clock and phase-locked loop (PLL) clock, which causes high cost.

SUMMARY

With embodiments of the present disclosure, cost may be reduced, and phase noise of a multi-times frequency multiplied reference clock signal may be optimized.

In an embodiment of the present disclosure, a frequency multiplying circuit for a clock signal is provided, including N branches and an N-times frequency multiplying circuit, wherein the N branches are coupled to the N-times frequency multiplying circuit, and have a same structure, wherein each of the N branches includes a buffer and a frequency doubling circuit coupled to the buffer, and the frequency doubling circuit is configured to double a frequency of a reference clock signal to obtain a frequency doubled reference clock signal, wherein the N-times frequency multiplying circuit includes: N second calibration delay circuits coupled to the N frequency doubling circuits in the N branches respectively, wherein each of the N second calibration delay circuits is configured to perform clock delay on the frequency doubled reference clock signal output by the corresponding frequency doubling circuit to obtain a clock delayed frequency doubled reference clock signal; and an N-path phase combination circuit coupled to the N second calibration delay circuits, and configured to perform phase combination on the N clock delayed frequency doubled reference clock signals output by the N second calibration delay circuits to obtain a 2N-times frequency multiplied reference clock signal.

In some embodiments, wherein the phase combination includes any one of the following ways: phase combination based on exclusive OR (XOR) gate, phase combination based on reset-set flip-flop, and phase combination based on multiplexing and switching.

In some embodiments, each of the N second calibration delay circuits is configured to perform clock delay on the frequency doubled reference clock signal output by the corresponding frequency doubling circuit using the following formula:

$$T_{delay}(k) = \frac{(k-1)T_{ref}}{2N}$$

where $T_{delay}(k)$ is a clock delay time of the $k^{th}$ second calibration delay circuit, $T_{ref}$ is a period of the reference clock signal, and k is a sequence number of the corresponding branch.

In some embodiments, the clock delay time of the second calibration delay circuit is related to a type of the buffer in the corresponding branch or a period of the reference clock signal in the corresponding branch.

In some embodiments, the buffers in the N branches have independent power supply and reference voltage sources, respectively.

In some embodiments, the frequency doubling circuit in each branch includes a duty cycle calibration circuit, a first calibration delay circuit and an XOR gate, wherein an input terminal of the duty cycle calibration circuit is coupled to an output terminal of the buffer, an output terminal of the duty cycle calibration circuit is coupled to an input terminal of the first calibration delay circuit and a first input terminal of the XOR gate, an output terminal of the first calibration delay circuit is coupled to a second input terminal of the XOR gate, and the duty cycle calibration circuit is configured to perform duty cycle calibration on the reference clock signal.

In some embodiments, the buffer in each branch includes a capacitor, an inverter and a resistor, wherein the capacitor is coupled to an input terminal of the inverter, and an output terminal of the inverter is coupled to the corresponding frequency doubling circuit, and two terminals of the resistor are coupled to the capacitor and the corresponding frequency doubling circuit.

Compared with the existing techniques, embodiments of the present disclosure may have following advantages. In embodiments of the present disclosure, a corresponding branch is configured for each buffer, that is, each buffer corresponds to a frequency doubling circuit and a second calibration delay circuit, and the reference clock signals output by the second calibration delay circuits corresponding to the buffers are subjected to the phase combination in the N-path phase combination circuit to obtain a 2N-times frequency multiplied reference clock signal. Quality of an in-band phase noise of a millimeter-wave PLL greatly depends on performance of the reference clock signal. The branches corresponding to the buffers are cascaded, and then phase combination is performed by the N-path phase combination circuit to realize frequency multiplying, so that phase noise of the branches corresponding to the buffers can be largely uncorrelated, and it may be guaranteed that correlated noise do not dominate. Therefore, the phase noise of the reference clock signal may be optimized. As no high-frequency oscillator is needed, the above solutions can be implemented based on a low-frequency module in an overall circuit, which is low in cost, and provides a multi-times frequency multiplied reference clock signal with high phase noise quality (i.e., optimizing phase noise of a multi-times frequency multiplied reference clock signal).

Further, the N branches are provided with independent power supply and reference voltage sources, respectively. In a higher phase noise application scenario, power supply noise corresponding to each branch is uncorrelated to further increase non-correlation of the phase noise of each branch to further optimize the phase noise of the multi-times frequency multiplied reference clock signal.

DETAILED DESCRIPTION

Figure 1:
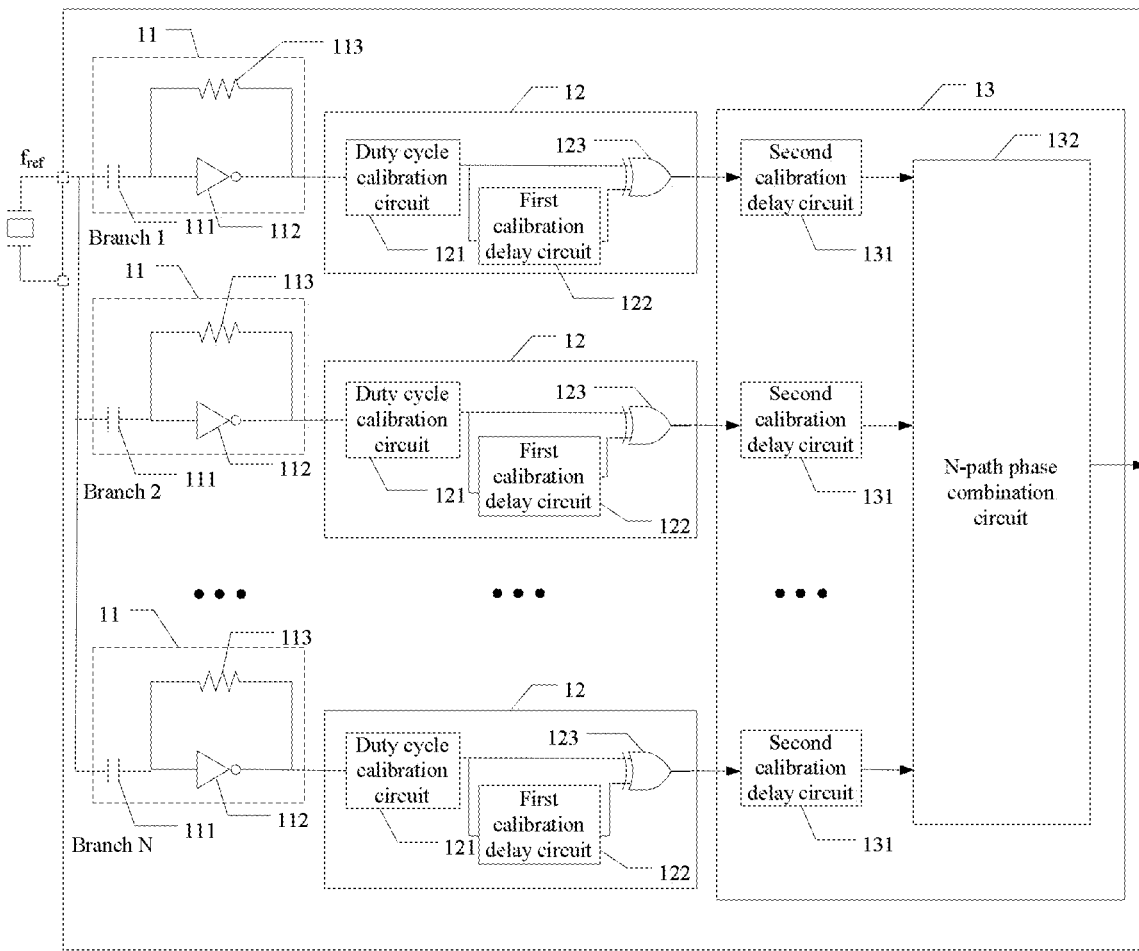
FIG. 1 schematically illustrates a structural diagram of a frequency multiplying circuit for a dock signal according to an embodiment of the present disclosure.

As described in the background, in existing frequency multiplying solutions, frequency multiplying is generally performed on a reference clock signal output by a single buffer, where a frequency of the reference clock signal is doubled using non-correlation of rising and falling edges of the single buffer. However, for a high-performance local oscillator application scenario, noise of a sine-to-square-wave buffer which contributes most phase noise of the reference clock signal is not optimized.

On one hand, the phase noise of the reference clock signal mainly comes from the sine-wave to square-wave buffer which generally consumes hundreds of micro-amps at a frequency of tens of megahertz. An upper limit of an in-band phase noise level of the reference clock signal output by the PLL is usually limited by a theoretical value of the phase noise of the reference clock plus 20 log(N). On the other hand, a higher reference frequency can also reduce noise contribution of other modules within bandwidth of the PLL. However, currently available high-frequency oscillators are expensive, and usually employ Micro Electro Mechanical Systems (MEMS) oscillators which have a large size and high power consumption.

In existing MIMO solutions, each phase control unit uses an independent reference clock, and each transceiver unit uses an independent reference clock and PLL clock. Correlated processing of a phase error is achieved by adding an independent crystal oscillator and cascading a PLL in the single transceiver unit, which is relatively expensive and high in power consumption. This is unsuitable to consuming electronic products for large-scale commercial use.

In embodiments of the present disclosure, a corresponding branch is configured for each buffer, that is, each buffer corresponds to a frequency doubling circuit and a second calibration delay circuit, and the reference clock signals output by the second calibration delay circuits corresponding to the buffers are subjected to the phase combination in the N-path phase combination circuit to obtain a 2N-times frequency multiplied reference clock signal. Quality of an in-band phase noise of a millimeter-wave PLL greatly depends on performance of the reference clock signal. The branches corresponding to the buffers are cascaded, and then phase combination is performed by the N-path phase combination circuit to realize frequency multiplying, so that phase noise of the branches corresponding to the buffers can be largely uncorrelated, and it may be guaranteed that correlated noise do not dominate. Therefore, the phase noise of the reference clock signal may be optimized. As no high-frequency oscillator is needed, the above solutions can be implemented based on a low-frequency module in an overall circuit, which is low in cost, and provides a multi-times frequency multiplied reference clock signal with high phase noise quality (i.e., optimizing phase noise of a multi-times frequency multiplied reference clock signal).

In order to clarify the objects, characteristics and advantages of the disclosure, embodiments of present disclosure will be described in detail in conjunction with accompanying drawings.

Referring to FIG. 1, FIG. 1 schematically illustrates a structural diagram of a frequency multiplying circuit for a clock signal according to an embodiment of the present disclosure.

In some embodiments, the frequency doubling circuit may include N branches, including branch 1, branch 2, . . . , and branch N, and N-times frequency multiplying circuit 13 coupled to the N branches. The N branches have a same structure. Each of the N branches includes a buffer 11 and a frequency doubling circuit 12 coupled to the buffer 11, and the frequency doubling circuit 12 is configured to double a frequency of a reference clock signal to obtain a frequency doubled reference clock signal. In some embodiments, PMOS and NMOS in the buffer 112 play a dominant role to jitter accumulation of rising and falling edges, respectively, and phase combination is performed by an exclusive OR (XOR) gate to obtain the frequency doubled reference clock signal.

In some embodiments, the N-times frequency multiplying circuit 13 may include N second calibration delay circuits 131 and an N-path phase combination circuit 132. The N second calibration delay circuits 131 are coupled to the N frequency doubling circuits 12, respectively, and are coupled to the N-path phase combination circuit 13. Each of the N second calibration delay circuits 131 is configured to perform clock delay on the frequency doubled reference clock signal output by the corresponding frequency doubling circuit 12 to obtain a clock delayed frequency doubled reference clock signal to be input into the N-path phase combination circuit 13. The N-path phase combination circuit 13 is configured to perform phase combination on the N clock delayed frequency doubled reference clock signals output by the N second calibration delay circuits 131 to obtain a 2N-times frequency multiplied reference clock signal.

In some embodiments, the N-path phase combination circuit 13 may perform phase combination on the N clock delayed frequency doubled reference clock signals via various phase combination ways to obtain the 2N-times frequency multiplied reference clock signal.

In some embodiments, the N-path phase combination circuit 13 may perform phase combination on the N clock delayed frequency doubled reference clock signals output by the N second calibration delay circuits 131 based on XOR gate to obtain the 2N-times frequency multiplied reference clock signal.

In some embodiments, the N-path phase combination circuit 13 may perform phase combination on the N clock delayed frequency doubled reference clock signals output by the N second calibration delay circuits 131 based on reset-set flip-flop to obtain the 2N-times frequency multiplied reference clock signal.

In some embodiments, the N-path phase combination circuit 13 may perform phase combination on the N clock delayed frequency doubled reference clock signals output by the N second calibration delay circuits 131 based on multiplexing and switching to obtain the 2N-times frequency multiplied reference clock signal.

In some embodiments, each of the N second calibration delay circuits 131 is configured to perform clock delay on the frequency doubled reference clock signal output by the corresponding frequency doubling circuit 12 using the following formula:

$$T_{delay}(k) = \frac{(k-1)T_{ref}}{2N}, \quad (1)$$

where $T_{delay}(k)$ is a clock delay time of the $k^{th}$ second calibration delay circuit, $T_{ref}$ is a period of the reference clock signal, and k is a sequence number of the corresponding branch.

In some embodiments, if k=1, $T_{delay}(1)$=0, that is, the first branch is not subjected to clock delay processing.

In some embodiments, the clock delay time of the N second calibration delay circuits 131 may be the same or different. The clock delay time of each second calibration delay circuit 131 is related to a type of the buffer 11 in the corresponding branch or a period of the reference clock signal in the corresponding branch.

In some embodiments, the buffers 11 in the N branches may have the same type or different types.

In some embodiments, the buffer 11 in each branch includes a capacitor 111, an inverter 112 and a resistor 113 in parallel with the inverter 112. The capacitor 111 is coupled to an input terminal of the inverter 112, and an output terminal of the inverter 112 is coupled to the corresponding frequency doubling circuit 12, and two terminals of the resistor 113 are coupled to the capacitor 111 and the corresponding frequency doubling circuit 12.

In some embodiments, the frequency doubling circuits 12 in the N branches may have the same structure. The frequency doubling circuit 12 in each branch includes a duty cycle calibration circuit 121, a first calibration delay circuit 122 and an XOR gate 123. The duty cycle calibration circuit 121 is configured to perform duty cycle calibration on the reference clock signal, an input terminal of the duty cycle calibration circuit 121 is coupled to an output terminal of the buffer 11, an output terminal of the duty cycle calibration circuit 121 is coupled to an input terminal of the first calibration delay circuit 122 and a first input terminal of the XOR gate 123, and an output terminal of the first calibration delay circuit 122 is coupled to a second input terminal of the XOR gate 123.

From above, in embodiments of the present disclosure, a corresponding branch is configured for each buffer, that is, each buffer corresponds to a frequency doubling circuit and a second calibration delay circuit, and the reference clock signals output by the second calibration delay circuits corresponding to the buffers are subjected to the phase combination in the N-path phase combination circuit to obtain a 2N-times frequency multiplied reference clock signal. Quality of an in-band phase noise of a millimeter-wave PLL greatly depends on performance of the reference clock signal. The branches corresponding to the buffers are cascaded, and then phase combination is performed by the N-path phase combination circuit to realize frequency multiplying, so that phase noise of the branches corresponding to the buffers can be largely uncorrelated, and it may be guaranteed that correlated noise do not dominate. Therefore, the phase noise of the reference clock signal may be optimized. As no high-frequency oscillator is needed, the above solutions can be implemented based on a low-frequency module in an overall circuit, which is low in cost, and provides a multi-times frequency multiplied reference clock signal with high phase noise quality (i.e., optimizing phase noise of a multi-times frequency multiplied reference clock signal).

Further, by using the frequency multiplying circuit for the clock signal provided in the embodiments of the present disclosure to multiply the reference clock signal, a period of the reference clock signal is increased by N times, and uncorrelated jitter corresponding to the reference clock signal is only superimposed with power.

In some embodiments, the branches in the frequency multiplying circuit for the clock signal may share power supply, that is, the same power supply is used to provide power to components, such as the buffers, in all branches.

In a higher phase noise application scenario, to further improve optimization of the phase noise of the reference clock signal, in some embodiments, the buffers corresponding to the N branches have independent power supply and reference voltage sources, respectively, which makes noise of the power supply be uncorrelated to further optimize the phase noise of the multi-times frequency multiplied reference clock signal.

For a PLL circuit, optimization of the phase noise in the PLL circuit involving the reference clock signal is usually measured by a jitter variance multiplied by power consumption. By using the technical solutions provided in the embodiments of the present disclosure, a lowest-frequency module in the frequency multiplying circuit for the clock signal may be employed, to optimize overall output clock jitter with low power consumption, that is, the phase noise of the multi-times frequency multiplied reference clock signal may be further optimized by 10 log N.

Figure 2:
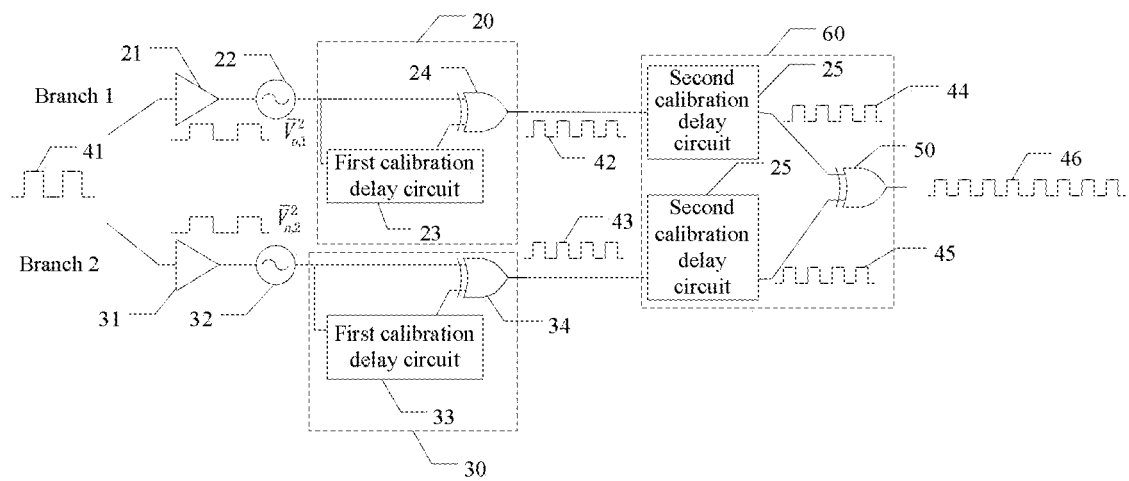
FIG. 2 schematically illustrates a structural diagram of a frequency multiplying circuit for a clock signal according to another embodiment of the present disclosure.

Referring to FIG. 2, FIG. 2 schematically illustrates a structural diagram of a frequency multiplying circuit for a clock signal according to another embodiment of the present disclosure.

To facilitate those skilled in the art better understanding and implementing the embodiments of the present disclosure, a structure of a 4-times frequency multiplying circuit for a clock signal is described below by taking N as 2 as an example. The 4-times frequency multiplying circuit performs 4 times the frequency of an input reference clock signal to obtain a 4-times frequency multiplied reference clock signal.

The 4-times frequency multiplying circuit includes two branches, including branch 1 and branch 2. The branch 1 includes a buffer 21 and an independent power supply 22, and a reference voltage of the independent power supply 22 is $\overline{V}_{n,1}^2$. The branch 2 includes a buffer 31 and an independent power supply 32, and a reference voltage of the independent power supply 32 is $\overline{V}_{n,2}^2$.

The reference clock signal 41 passes the buffer 21 of the branch 1, and passes the frequency doubling circuit 20 consisting of the first calibration delay circuit 23 and the XOR gate 24 to obtain a frequency doubled reference clock signal 42. The frequency doubled reference clock signal 42 is input to the N-times frequency multiplying circuit 60, and then subjected to clock delay calibration in the second calibration delay circuit 25 to obtain a clock delayed frequency doubled reference clock signal 44 which is then input to the XOR gate 50.

The reference clock signal 41 passes the buffer 31 of the branch 2, and passes the frequency doubling circuit 30 consisting of the first calibration delay circuit 33 and the XOR gate 34 to obtain a frequency doubled reference clock signal 43. The frequency doubled reference clock signal 43 is input to the N-times frequency multiplying circuit 60, and then subjected to clock delay calibration in the second calibration delay circuit 35 to obtain a clock delayed frequency doubled reference clock signal 45 which is then input to the XOR gate 50. The XOR gate 50 uses XOR gate combination to phase combine the input clock delayed frequency doubled reference clock signal 44 and the input clock delayed frequency doubled reference clock signal 45 to obtain a 4-times frequency multiplied reference clock signal 46, and outputs the 4-times frequency multiplied reference clock signal 46.

Although the present disclosure has been disclosed above with reference to preferred embodiments thereof, it should be understood that the disclosure is presented by way of example only, and not limitation. Those skilled in the art can modify and vary the embodiments without departing from the spirit and scope of the present disclosure. Therefore, the protection scope of the present disclosure is subject to the scope defined by the claims.

What is claimed is:

1. A frequency multiplying circuit for a clock signal, comprising N branches and an N-times frequency multiplying circuit,
   wherein the N branches are coupled to the N-times frequency multiplying circuit, and have a same structure,
   wherein each of the N branches comprises a buffer and a frequency doubling circuit coupled to the buffer, and the frequency doubling circuit is configured to double a frequency of a reference clock signal to obtain a frequency doubled reference clock signal,
   wherein the N-times frequency multiplying circuit comprises:
       N first calibration delay circuits coupled to the N frequency doubling circuits in the N branches, respectively, wherein each of the N first calibration delay circuits is configured to perform clock delay on the frequency doubled reference clock signal output by the corresponding frequency doubling circuit to obtain a clock delayed frequency doubled reference clock signal; and
       an N-path phase combination circuit coupled to the N first calibration delay circuits, and configured to perform phase combination on the N clock delayed frequency doubled reference clock signals output by the N first calibration delay circuits to obtain a 2N-times frequency multiplied reference clock signal.

2. The frequency multiplying circuit according to claim 1, wherein the phase combination comprises:
   phase combination based on exclusive OR (XOR) gate, phase combination based on reset-set flip-flop, or phase combination based on multiplexing and switching.

3. The frequency multiplying circuit according to claim 1, wherein each of the N first calibration delay circuits is configured to perform clock delay on the frequency doubled reference clock signal output by the corresponding frequency doubling circuit using the following formula:

$$T_{delay}(k) = \frac{(k-1)T_{ref}}{2N}$$

where $T_{delay}(k)$ is a clock delay time of the $k^{th}$ first calibration delay circuit, $T_{ref}$ is a period of the reference clock signal, and k is a sequence number of the corresponding branch.

4. The frequency multiplying circuit according to claim 3, wherein the clock delay time of the first calibration delay circuit is related to the buffer in the corresponding branch or a period of the reference clock signal in the corresponding branch.

5. The frequency multiplying circuit according to claim 1, wherein the buffers in the N branches have independent power supply and reference voltage sources, respectively.

6. The frequency multiplying circuit according to claim 2, wherein the buffers in the N branches have independent power supply and reference voltage sources, respectively.

7. The frequency multiplying circuit according to claim 3, wherein the buffers in the N branches have independent power supply and reference voltage sources, respectively.

8. The frequency multiplying circuit according to claim 4, wherein the buffers in the N branches have independent power supply and reference voltage sources, respectively.

9. The frequency multiplying circuit according to claim 1, wherein the frequency doubling circuit in each branch comprises a duty cycle calibration circuit, a second calibration delay circuit and an XOR gate,
   wherein an input terminal of the duty cycle calibration circuit is coupled to an output terminal of the buffer, an output terminal of the duty cycle calibration circuit is coupled to an input terminal of the second calibration delay circuit and a first input terminal of the XOR gate, an output terminal of the second calibration delay circuit is coupled to a second input terminal of the XOR gate, and the duty cycle calibration circuit is configured to perform duty cycle calibration on the reference clock signal.

10. The frequency multiplying circuit according to claim 2, wherein the frequency doubling circuit in each branch comprises a duty cycle calibration circuit, a second calibration delay circuit and an XOR gate,
    wherein an input terminal of the duty cycle calibration circuit is coupled to an output terminal of the buffer, an output terminal of the duty cycle calibration circuit is coupled to an input terminal of the second calibration delay circuit and a first input terminal of the XOR gate, an output terminal of the second calibration delay circuit is coupled to a second input terminal of the XOR gate, and the duty cycle calibration circuit is configured to perform duty cycle calibration on the reference clock signal.

11. The frequency multiplying circuit according to claim 3, wherein the frequency doubling circuit in each branch comprises a duty cycle calibration circuit, a second calibration delay circuit and an XOR gate,
    wherein an input terminal of the duty cycle calibration circuit is coupled to an output terminal of the buffer, an output terminal of the duty cycle calibration circuit is coupled to an input terminal of the second calibration delay circuit and a first input terminal of the XOR gate, an output terminal of the second calibration delay circuit is coupled to a second input terminal of the XOR gate, and the duty cycle calibration circuit is configured to perform duty cycle calibration on the reference clock signal.

12. The frequency multiplying circuit according to claim 4, wherein the frequency doubling circuit in each branch comprises a duty cycle calibration circuit, a second calibration delay circuit and an XOR gate,
wherein an input terminal of the duty cycle calibration circuit is coupled to an output terminal of the buffer, an output terminal of the duty cycle calibration circuit is coupled to an input terminal of the second calibration delay circuit and a first input terminal of the XOR gate, an output terminal of the second calibration delay circuit is coupled to a second input terminal of the XOR gate, and the duty cycle calibration circuit is configured to perform duty cycle calibration on the reference clock signal.

13. The frequency multiplying circuit according to claim 1, wherein the buffer in each branch comprises a capacitor, an inverter and a resistor,
wherein the capacitor is coupled to an input terminal of the inverter, and an output terminal of the inverter is coupled to the corresponding frequency doubling circuit, and two terminals of the resistor are coupled to the capacitor and the corresponding frequency doubling circuit.

14. The frequency multiplying circuit according to claim 2, wherein the buffer in each branch comprises a capacitor, an inverter and a resistor,
wherein the capacitor is coupled to an input terminal of the inverter, and an output terminal of the inverter is coupled to the corresponding frequency doubling circuit, and two terminals of the resistor are coupled to the capacitor and the corresponding frequency doubling circuit.

15. The frequency multiplying circuit according to claim 3, wherein the buffer in each branch comprises a capacitor, an inverter and a resistor,
wherein the capacitor is coupled to an input terminal of the inverter, and an output terminal of the inverter is coupled to the corresponding frequency doubling circuit, and two terminals of the resistor are coupled to the capacitor and the corresponding frequency doubling circuit.

16. The frequency multiplying circuit according to claim 4, wherein the buffer in each branch comprises a capacitor, an inverter and a resistor,
wherein the capacitor is coupled to an input terminal of the inverter, and an output terminal of the inverter is coupled to the corresponding frequency doubling circuit, and two terminals of the resistor are coupled to the capacitor and the corresponding frequency doubling circuit.

* * * * *